United States Patent
Murphy et al.

(10) Patent No.: US 11,348,622 B2
(45) Date of Patent: May 31, 2022

(54) CONDITIONAL WRITE BACK SCHEME FOR MEMORY

(71) Applicant: Micron Technology, Inc., Boise, ID (US)

(72) Inventors: Richard C. Murphy, Boise, ID (US); Glen E. Hush, Boise, ID (US); Honglin Sun, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 58 days.

(21) Appl. No.: 16/867,649

(22) Filed: May 6, 2020

(65) Prior Publication Data

US 2021/0350835 A1 Nov. 11, 2021

(51) Int. Cl.
| G11C 7/06 | (2006.01) |
| G11C 7/10 | (2006.01) |
| G06F 9/46 | (2006.01) |

(52) U.S. Cl.
CPC .............. G11C 7/065 (2013.01); G06F 9/467 (2013.01); G11C 7/106 (2013.01); G11C 7/1039 (2013.01); G11C 7/1087 (2013.01)

(58) Field of Classification Search
CPC ....... G11C 7/065; G11C 7/1039; G11C 7/106; G11C 7/1087

USPC .............. 365/205, 230.06, 230.08, 185.023, 365/185.021
See application file for complete search history.

(56) References Cited

U.S. PATENT DOCUMENTS

| 5,050,095 | A | 9/1991 | Samad | |
| 7,043,466 | B2 | 5/2006 | Watanabe et al. | |
| 7,283,405 | B2 * | 10/2007 | Yamanaka | G11C 7/1012 |
| | | | | 365/185.08 |
| 8,024,394 | B2 | 9/2011 | Prokopenko et al. | |
| 10,387,332 | B1 | 8/2019 | Metcalf et al. | |
| 10,552,310 | B2 | 2/2020 | Sheffler et al. | |
| 2002/0015328 | A1 * | 2/2002 | Dono | G11C 29/789 |
| | | | | 365/185.08 |
| 2004/0073764 | A1 | 4/2004 | Andreasson | |
| 2011/0128810 | A1 * | 6/2011 | Sato | H04N 19/423 |
| | | | | 365/230.06 |
| 2020/0202939 | A1 * | 6/2020 | Hush | G11C 7/1006 |

* cited by examiner

*Primary Examiner* — Connie C Yoha
(74) *Attorney, Agent, or Firm* — Brooks, Cameron & Huebsch, PLLC

(57) ABSTRACT

Apparatuses and methods can be related to implementing a conditional write back scheme for memory. The data may be stored by memory cells of a memory array. The data may be moved to sense circuitry. The data can be conditionally held by the sense circuitry while a plurality of operations is performed. The results of the plurality of operations can dictate whether to commit the data to the memory cells.

19 Claims, 4 Drawing Sheets

CONDITIONAL WRITE BACK SCHEME FOR MEMORY

TECHNICAL FIELD

The present disclosure relates generally to memory, and more particularly to apparatuses and methods associated with implementing a conditional write back scheme for memory.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. including, but not limited to personal computers, portable memory sticks, digital cameras, cellular telephones, portable music players such as MP3 players, movie players, and other electronic devices. Memory cells can be arranged into arrays, with the arrays being used in memory devices.

Data can be written to memory by controlling a row control and a column control. The row control and the column control can activate and deactivate rows and columns of a memory array to write the data to memory cells of the memory array.

DETAILED DESCRIPTION

Figure 1:
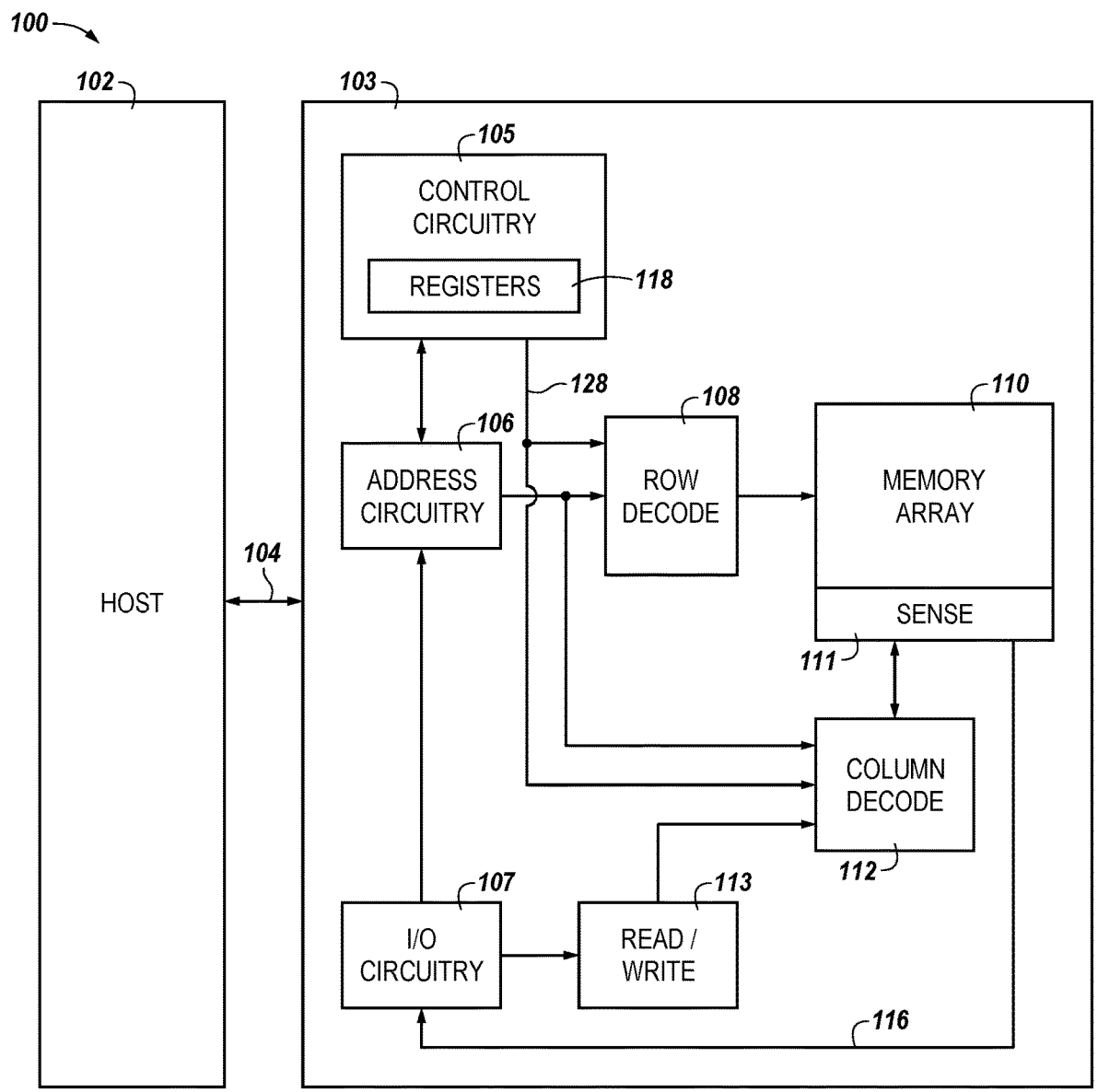
FIG. 1 is a block diagram of an apparatus in the form of a computing system including a memory device in accordance with a number of embodiments of the present disclosure.

The present disclosure includes apparatuses and methods related to implementing a conditional writeback scheme for memory. A memory device can store data in memory cells. In various examples, the storing of the data in the memory cells may be conditional based on a result of a plurality of operations.

Security measures may be implemented to ensure the security of data and/or a memory device. Implementing the security measures may delay the storage of data and/or the use of the data. For example, data may be stored in a memory device responsive to determining that the memory device is safe and/or that the mechanisms used to store the data will not corrupt the data and/or other data stored in the memory device.

In various instances, the security measure may be implemented outside of the memory device and the data may be provided to the memory device after determining that the data and/or the memory device is safe. In such examples, the storage of the data may be delayed. Processing resources may be limited to performing the security measures prior to providing the data to the memory device such that performing the security measures may be a bottleneck which limits the ability of the processing resource to perform other operations.

The operations that are performed prior to storing the data to the memory device may be operations other than security operations. In various instances, the operations that are performed prior to storing the data in a memory array may be performed internally to the memory device. For example, a plurality of operations may be performed responsive to receipt of a memory access command. The memory access command may not be processed until the plurality of operations are performed and as such data to be stored may not be provided to a memory array until the plurality of operations are performed. Refraining from providing data to the memory array until the plurality of operations are performed may limit the memory device's ability to receive and process other commands.

In various examples, implementing conditional write back schemes in memory may provide the ability to use portions of a memory device as transactional memory where the portions of the memory device may traditionally not function as transactional memory. As used herein, transactional memory includes memory that can execute store commands in an atomic way such that the store commands are indivisible and irreducible instructions that are performed or are not performed.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 is a block diagram of an apparatus in the form of a computing system 100 including a memory device 103 in accordance with a number of embodiments of the present disclosure. As used herein, a memory device 103, memory array 110, and/or a host 102, for example, might also be separately considered an "apparatus."

In this example, the computing system 100 includes a host 102 coupled to memory device 103 via an interface 104. The computing system 100 can be a personal laptop computer, a desktop computer, a digital camera, a mobile telephone, a memory card reader, or an Internet-of-Things (IoT) enabled device, among various other types of systems. Host 102 can include a number of processing resources (e.g., one or more processors, microprocessors, or some other type of controlling circuitry) capable of accessing memory 102. The computing system 100 can include separate integrated circuits, or both the host 102 and the memory device 103 can be on the same integrated circuit. For example, the host 102 may be a system controller of a memory system comprising multiple memory devices 103, with the system controller providing access to the respective memory devices 103 by another processing resource such as a central processing unit (CPU).

In the example shown in FIG. 1, the host 102 is responsible for executing an operating system (OS) and/or various applications that can be loaded thereto (e.g., from memory device 103 via control circuitry 105). The OS and/or various applications can be loaded from the memory device 103 by providing access commands from the host 102 to the memory device 103 to access the data comprising the OS and/or the various applications. The host 102 can also access data utilized by the OS and/or various applications by providing access commands to the memory device 103 to retrieve said data utilized in the execution of the OS and/or the various applications.

For clarity, the computing system 100 has been simplified to focus on features with particular relevance to the present disclosure. The memory array 110 can be a DRAM array, SRAM array, STT RAM array, PCRAM array, TRAM array, RRAM array, NAND flash array, and/or NOR flash array, for instance. The array 110 can comprise memory cells arranged in rows coupled by access lines (which may be referred to herein as word lines or select lines) and columns coupled by sense lines (which may be referred to herein as digit lines or data lines). Although the memory array 110 is shown as a single memory array, the memory array 110 can represent a plurality of memory array arraigned in banks of the memory device 103.

The memory device 103 includes address circuitry 106 to latch address signals provided over an interface 104. The interface can include, for example, a physical interface employing a suitable protocol (e.g., a data bus, an address bus, and a command bus, or a combined data/address/command bus). Such protocol may be custom or proprietary, or the interface 104 may employ a standardized protocol, such as Peripheral Component Interconnect Express (PCIe), Gen-Z interconnect, cache coherent interconnect for accelerators (CCIX), or the like. Address signals are received and decoded by a row decoder 108 and a column decoder 112 to access the memory arrays 110. Data can be read from memory arrays 110 by sensing voltage and/or current changes on the sense lines using sensing circuitry 111. The sensing circuitry 111 can be coupled to the memory arrays 110. Each memory array and corresponding sensing circuitry can constitute a bank of the memory device 103. The sensing circuitry 111 can comprise, for example, sense amplifiers that can read and latch a page (e.g., row) of data from the memory array 110. The I/O circuitry 107 can be used for bi-directional data communication with the host 102 over the interface 104. The read/write circuitry 113 is used to write data to the memory arrays 110 or read data from the memory arrays 110. As an example, the circuitry 113 can comprise various drivers, latch circuitry, etc.

Control circuitry 105 decodes signals provided by the host 102. The signals can be commands provided by the host 102. These signals can include chip enable signals, write enable signals, and address latch signals that are used to control operations performed on the memory array 110, including data read operations, data write operations, and data erase operations. In various embodiments, the control circuitry 105 is responsible for executing instructions from the host 102. The control circuitry 105 can comprise a state machine, a sequencer, and/or some other type of control circuitry, which may be implemented in the form of hardware, firmware, or software, or any combination of the three. In some examples, the host 102 can be a controller external to the memory device 103. For example, the host 102 can be a memory controller which is coupled to a processing resource of a computing device. Data can be provided to the memory array 110 and/or from the memory array via the data lines 116.

The memory device can be operated in a plurality of different modes. For example, the memory device can operate in one of a first mode or a second mode. In a second mode, the memory device can be configured to implement transactional memory. In a first mode, the memory device can be configured to function without the use of transactional memory.

Figure 2:
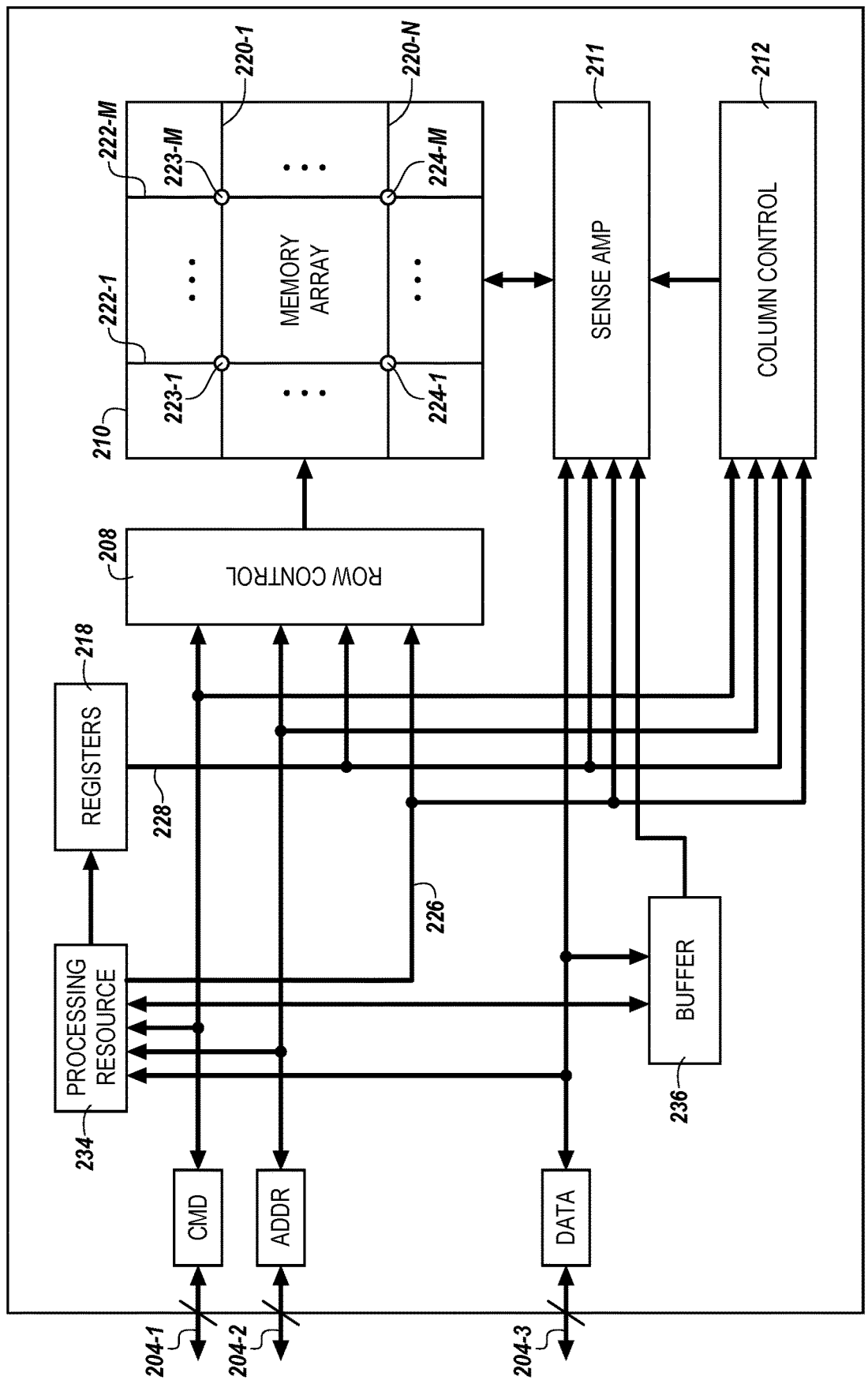
FIG. 2 is a block diagram of an apparatus in the form a memory device including a row decode in accordance with a number of embodiments of the present disclosure.

In various examples, the host 102 can cause signals to be provided to the memory device 103 to select a second mode or a first mode. The processing resource that selects the first mode or the second mode can be internal to the memory device 103 or external to the memory device 103. For example, the processing resource can be incorporated in the host 102 or can be incorporated in the memory device 103. The processing resource can be implemented under the memory array 110 and/or can be implemented in the periphery of the memory device 103 as shown in FIG. 2.

The control circuitry 105 can decode signals received. Responsive to decoding the signals, the control circuitry 105 can set a register 118 to configure the memory device in a first mode or a second mode. Although the register 118 is shown as a single register, the register 118 can represent one or more registers. Although the register 118 is shown as being implemented in the control circuitry 105, the register 118 can be implemented external to the control circuitry 105.

The register 118 can be coupled to the row decode 108 and the column decode 112 via line 128. The register 118 can provide signals to the row decode 108 and the column decode 112 indicating that the memory device 103 is in a first mode or a second mode. If the register 118 is implemented in the control circuitry 105 as shown in FIG. 1, the row decode 108 and the column decode 112 can be coupled to the control circuitry 105 via the line 128.

The function of the row decode 108 and/or the column decode 112 can change based on whether the memory device 103 is in a first mode or a second mode. For example, the row decode 108 and/or the column decode 112 can activate and/or deactivate rows and/or columns of the memory array 110 conditional on a result of a plurality of operations. As used herein, activating and deactivating can also be describes as activating and closing, respectively. For instance, activating a row can also be descried as activating the row. Conditionally writing data to the memory array 110 can provide the ability to perform security operations, mapping operations, and/or different types of operations prior to determining whether to store the data to memory cells of the memory array 110. The data can be held in different memory cells and/or the sensing circuitry 111 of the memory array 110 prior to committing the data to the memory cells of the memory array 110. The different memory cells and/or the sensing circuitry 111 can function as transactional memory.

FIG. 2 is a block diagram of an apparatus in the form a memory device 203 including a row decode 208 in accordance with a number of embodiments of the present disclosure. The memory device 203 includes the row control 208, the memory array 210, the sense amplifier 211, and the column control 212. The memory device 203 also includes a command interface 204-1, the address interface 204-2, and the data interface 204-3. The memory device 203 can also include a processing resource 234 coupled to the row control 208, the column control 212, and the sense amplifier 211. The memory device 203 can also be coupled to the command interface 204-1, the address interface 204-2, and/or the data interface 204-3. The memory device 203 further comprises the registers 218 coupled to the row control 208, the column control 212, and the sense amplifiers 211. The memory device 203 can also comprise a buffer 236 coupled to the sense amplifiers 211 and the data interface 204-3.

The commands provided to the memory device 203 to place the memory device 203 in a given mode can be provided via the command interface 204-1, the address interface 204-2, and/or the data interface 204-3. After being placed in a particular mode, the memory device 203 can implement transactional memory utilizing the sense amplifiers 211 and/or memory cells of the memory array 210.

The transactional aspect of the transactional memory can be utilized to perform a plurality of operation while holding the data in the transactional memory. The transactional aspect of the transactional memory can also be utilized to store data from the transaction memory to memory cells of the memory array 210 based on the result of the plurality of operations.

While being configured to function in a mode that enables the transactional memory, the memory device 203 can receive a store command via the command interface 204-1, the address interface 204-2, and the data interface 204-3, referred to as interfaces 204. The store command can be associated with data to store and an address corresponding to memory cells that store the data. The data can be provided to the memory array 210. The memory array 210 can store the data in a plurality of memory cells 223-1, . . . , 223-M.

To store data in the memory cells 223-1 to 223-M and 224-1 to 224-M, the row control 208 can activate rows 220-1 to 220-N (e.g., referred to as rows 220) of the memory array 210 and the column control 212 can activate columns 222-1 to 222-M (e.g., referred to as columns 222) of the memory array 210. Activating and deactivating rows or columns of the memory array 210 can include making electrical connections between rows of memory cells or columns of memory cells and select lines or sense lines. The activating of rows 220 and columns 222 can be coordinated by the row control 208 and the column control 212 to read from or write data to the memory cells. For example, the row 220-1 and the columns 222-1 to 222-M can be activated by the row control 208 and the column control 212 to transfer a charge from the memory cells 223-1 to 223-M to the sense amplifiers 211. The row 220-1 and the columns 222-1 to 222-M can also be activated by the row control 208 and the column control 212 to transfer a charge from the sense amplifiers 221 to the memory cells 223-1 to 223-M.

Data corresponding to the store command can be saved to the memory cells 223-1 to 223-M by activating the row 220-1 and the columns 222-1 to 222-M. While the row 220-1 is activated, the data stored in the memory cells 223-1 to 223-M can be latched in the sense amplifiers 211. Responsive to latching the data in the sense amplifiers 211, the row 220-1 can be deactivated by the row control 208. Deactivating the row 220-1, after charges stored by the row 220-1 of memory cells 223-1 to 223-M has been transferred and stored by the sense amplifier 211, can result in the memory cells 223-1 to 223-M being deleted such that the charges representing the data are no longer stored by the memory cells 223-1 to 223-M.

The sense amplifiers 211 can hold the latch data if the memory device 203 is operating in a mode that enables the sense amplifiers 211 to function as transactional memory. Holding the latched data in the sense amplifiers 211 can provide a duration of time in which the processing resource 234 can perform a plurality of operations without committing the data to the memory cells 223-1 to 223-M. Although the processing resource 234 is shown as being implemented in the periphery of the memory device 203, the processing resource 234 can also be implemented under the memory array 210 and/or externally to the memory device 203.

The processing resource 234 can perform operations which can determine whether the data is to be stored in the memory cells 223-1 to 223-M, the memory cells 224-1 to 224-M, or not stored in the memory cells 223-1 to 223-M or 224-1 to 224-M. For example, the processing resource 234 can perform security operations such as operations to detect row hammer attacks, among other security threats on the data to store or the memory cells of the memory array 210.

The processing resource 234 can also perform operations to map an address corresponding to the store command and provided via the address interface 204-2 to a different address. In such examples, the sense amplifiers 211 can function as transactional memory for address mapping. For example, the transactional memory can hold the data while the processing resource 234 performs a plurality of operations corresponding to mapping the addresses. Responsive to performing the operations, the data can be moved from the transactional memory to memory cells having a new address. The original address provided with the store command can be mapped to the new address. The processing resources 234 can also perform operations for different purposes, the results which can be used to determine whether to write the data latched by the sensing circuitry 211 back to the memory array 210.

If the result of performing the operations via the processing resource 234 is indicative that the latched data should be committed, then the row control 208 can reactivate the row 220-1. Reactivating the row 220-1 can transfer the charges stored by the sensing circuitry 211 back to the memory cells 223-1, . . . , 223-M. If a result of performing the operations via the processing resource 234 indicates that the latched data should be committed to a row other than row 220-1, then the row control 208 can activate the row 220-N, for example, to transfer the charges stored by the sensing circuitry 211 to the memory cells 224-1, . . . , 224-M. If a result of performing the operations via the processing resource 234 indicates that the latched data should be committed to multiple rows, then the row control 208 can activate the row 220-1 and the row 220-N to transfer the charges stored by the sensing circuitry 211 back to the memory cells 223-1, . . . , 223-M and to the memory cells 224-1, . . . , 224-M. The row 220-1 and the row 220-N can be simultaneously activated.

In examples where the data is read from a row 220-1, retained in the sense amplifiers 211 while the processing resource 234 performs operations, and stored to a different row 220-N based on the results of the operations, the memory device can track the mapping of the data from memory cells 223-1 to 223-M having an addresses corresponding to the store command to memory cells 224-1 to 224-M having a different addresses. The memory device 203 can generate a mapping utilizing registers 218 for example such that the mapping between the addresses and the different addresses is recorded by the registers 218.

If the result of the operations indicate that the data should not be committed, then the row control 208 may refrain from activating a row (e.g., row 220-1) to transfer the data from the sense amplifiers 211 to row 220-1 of the memory cells. Refraining from activating a row prevents the data from being stored to the memory cells of the memory array 210.

Performing a plurality of operations while the data is latched in the sense amplifiers 211 renders the memory array 210 unavailable. However, other memory arrays (e.g., banks) may be available such that the memory device may utilize the other memory arrays while the memory array 210 is unavailable.

In various examples, rows of the memory array 210 may be utilized as transactional memory instead of utilizing the sense amplifiers 211 as transactional memory. For example, the data may be read from the memory cells 223-1 to 223-M by activating the row 220-1. The data may be latched by the sense amplifiers 211. The row 220-N may be activated to transfer the data from the sense amplifiers 211 to the memory cells 224-1 to 224-M. The data may be retained in the memory cells 224-1 to 224-M while the processing resource 234 performs a plurality of operations. Responsive to performing the plurality of operations, the row control 208 can activate the row 220-N to latch the data in the sense amplifiers 211. Responsive to the result of the operations, the row 220-1 can be activated to store the data in the memory cells 223-1 to 223-M or the row 220-1 may not be activated to refrain from storing the data in the memory cells 223-1 to 223-M or the memory cells 224-1 to 224-M. In various examples, the row 220-N of memory cells 224-1, . . . , 224-M may be a redundant row utilized to repair the memory array 210. A redundant row may be utilized as part of an error correction code (ECC). Although a redundant row may be utilized for purposes not described in detail herein (e.g., ECC), the redundant row may be utilized as transactional memory.

In various examples, the transactional memory can be used to read data from the memory array 210. For example, the row 220-1 can be activated to latch the data in the sense amplifiers 211. The data can be retained by the sense amplifiers 211 while the processing resource 234 performs a plurality of operations. Based on the signal provided by the processing resource 234 to the row control 208, the sense amplifiers 211, and/or the column control 212, the data may be provided to the data interface 204-3 or may be stored back to the memory array 210 by activating a row of the memory array 210. Retaining the data in the sense amplifiers 211 may render the memory array 210 unavailable until the processing resource 234 provides a signal to the row control 208, the sense amplifiers 211, and/or the column control 212.

In various examples, a signal can be provided from the processing resource 234 to the row control 208, the sense amplifiers 211, and/or the column control via the line 226. The line 226 can be referred to as a control line because the line 226 can provide signals that control whether the row control 208 activates rows of the memory array 210 or does not activate rows of the memory array 210. Although the processing resource 234 is shown as providing signals to the row control 208 and the column control 212 via the line 226, other components of the memory device 203 can provide signals to the row control 208 and/or the column control 212 via the line 226. For example, the control circuitry 105 of FIG. 1 can provide signals via the line 226 to control the activating and deactivating of the rows of the memory array 203. In various instances, the operations performed by the processing resource 234 can be performed on the data stored by the sense amplifiers 211 prior to committing the data to the memory cells of the memory array 210.

The buffer 236 can be coupled to the data interface 204-3 and the sense amplifier 211. The buffer 236 can store data received via the data interface 204-3. In some examples, the buffer 236 can be used as a cache system for the data stored in the memory array 210, and/or the sense amplifier 211. For example, the buffer 236 can store data that is also stored in the sense amplifier 211. The processing resource 234 can access the data stored in the buffer 236 to perform operations used to determine whether to commit the data stored in the sense amplifiers 211 to the memory array 210.

In various instances, the registers 218 can also be coupled to the processing resource 234. The processing resource 234 can set a mode of the memory array 210 by storing one or more values in the registers 218. For example, the registers 218 can indicate a first mode under which the sense amplifiers 211 are not used as transactional memory or a second mode under which the sense amplifiers 211 are used as transaction memory.

The processing resource 234 can receive commands and addresses via the command interface 204-1 and the address interface 204-2 to set the registers 218. The processing resource 234 can set the mode registers 218 responsive to receiving commands indicating the same. The processing resource 234 can access the registers 218 to determine whether to perform a plurality of operations on the data stored in the sense amplifiers 211 and/or buffer 236. Responsive to determining that the data is to be committed to the memory array 210, the processing resource 234 can provide signals to the row control 208 and/or the column control 212 to commit the data stored in the sense amplifiers 211 to specific row 220 and/or columns 222 of the memory array 210.

Figure 3:
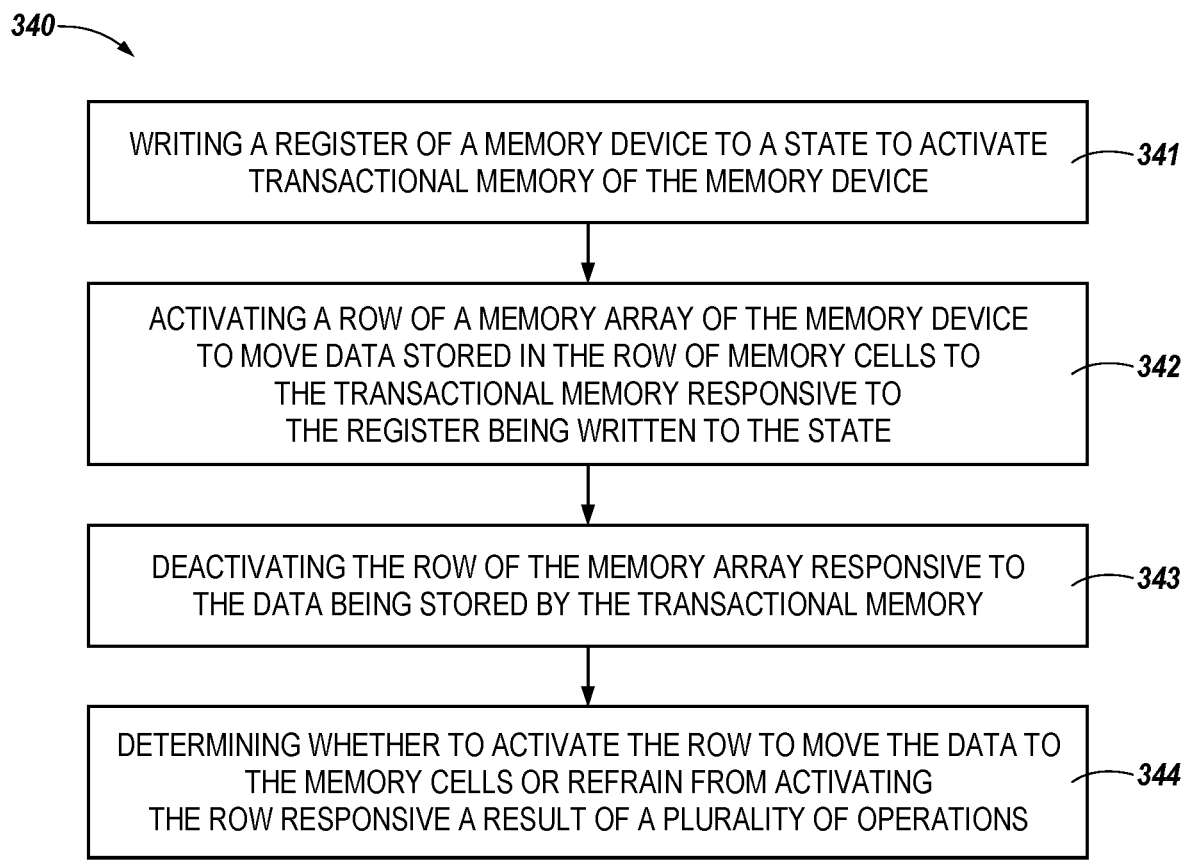
FIG. 3 illustrates an example flow diagram of a method for performing operations in memory in accordance with a number of embodiments of the present disclosure.

FIG. 3 illustrates an example flow diagram of a method 340 for performing operations in memory in accordance with a number of embodiments of the present disclosure. At 341, a register of a memory device can be set to a state to activate transactional memory of the memory device. A first state of the register can indicate an activation of the transactional memory while a second state of the transactional memory can indicate a deactivation of the transactional memory. In some examples, a first state of the register can indicate that sense amplifiers are to be used as transactional memory. A second state of the register can indicate that the sense amplifiers are not to be used as transactional memory.

At 342, a row of the memory array of the memory device can be activated to move data stored in a row of memory cells to the transactional memory responsive to the register being set to the state. At 343, the row of the memory array can be deactivated responsive to the data being stored by the transactional memory. Deactivating the row can result in the data being removed from the memory cells such that the data may not be accessible from the memory cells. At 343, it can be determined whether to activate the row to move the data to the memory cells or refrain from activating the row responsive to a result of the plurality of operations. Moving the data back to the memory cells can commit the data to the memory cells. A result of the plurality of operations can indicate that there is a security risk in committing the data to the memory cells, for example. In such examples, the row may not be activated to refrain from committing the data to the memory cells.

A host can provide a command to the memory device to activate the transactional memory. The control circuitry of the memory device can set the register of the memory device responsive to receipt of the command by the memory device.

In a number of examples, a processing resource internal to the memory device can provide the command to activate the transactional memory.

Activating a row of the memory array of the memory device can include latching the data in sensing circuitry. The sensing circuitry can comprise the transactional memory.

In various instances, the data can be held by the transactional memory concurrently while a determination is made whether to commit the data or not to commit the data to the memory cells. The determination can be made by performing a number of operations. The operations can be performed internally to the memory device or externally to the memory device. The determination whether to commit the data or not commit the data to the memory cells can include determining whether it is safe to activate the row to move the data to the memory cells.

In a number of examples, a row decode coupled to the memory array and configured to activate a first row of the memory array to move data to the plurality of sense amplifiers and deactivate the first row of the memory array responsive to the data being latched by the plurality of sense amplifiers. The row decode can receive a signal to commit the data to a second row of memory cells of the memory array and can activate the second row of the memory array responsive to receipt of the signal. The second row can be a redundant row of the memory array.

The first row can be activated concurrently with the activating of the second row to store the data to the memory cells coupled to the first row of the memory array and to the memory cells coupled to the second row. A register can be coupled to the row decode. The register can be configured to provide the signal responsive to the apparatus being configured to utilize the second row of the memory cells as transactional memory.

A processing resource can be coupled to the row decide. The processing resource can be configured to perform the plurality of operations utilizing the data. The processing resource can provide a different signal or can refrain from providing the different signal to the row decode responsive to a result of the plurality of operations indicating that the data is to be committed to memory cells coupled to the first row.

The row decode can further be configured to receive the different signal via a line coupling the processing resource to the row decode. The row decode can activate the second row of the memory array to move the data to the plurality of sense amplifiers. The row decode can deactivate the second row of the memory array responsive to the data being latched in the plurality of sense amplifiers. The row decode can activate the first row of the memory array responsive to receipt of the different signal to commit the data to the first row.

Figure 4:
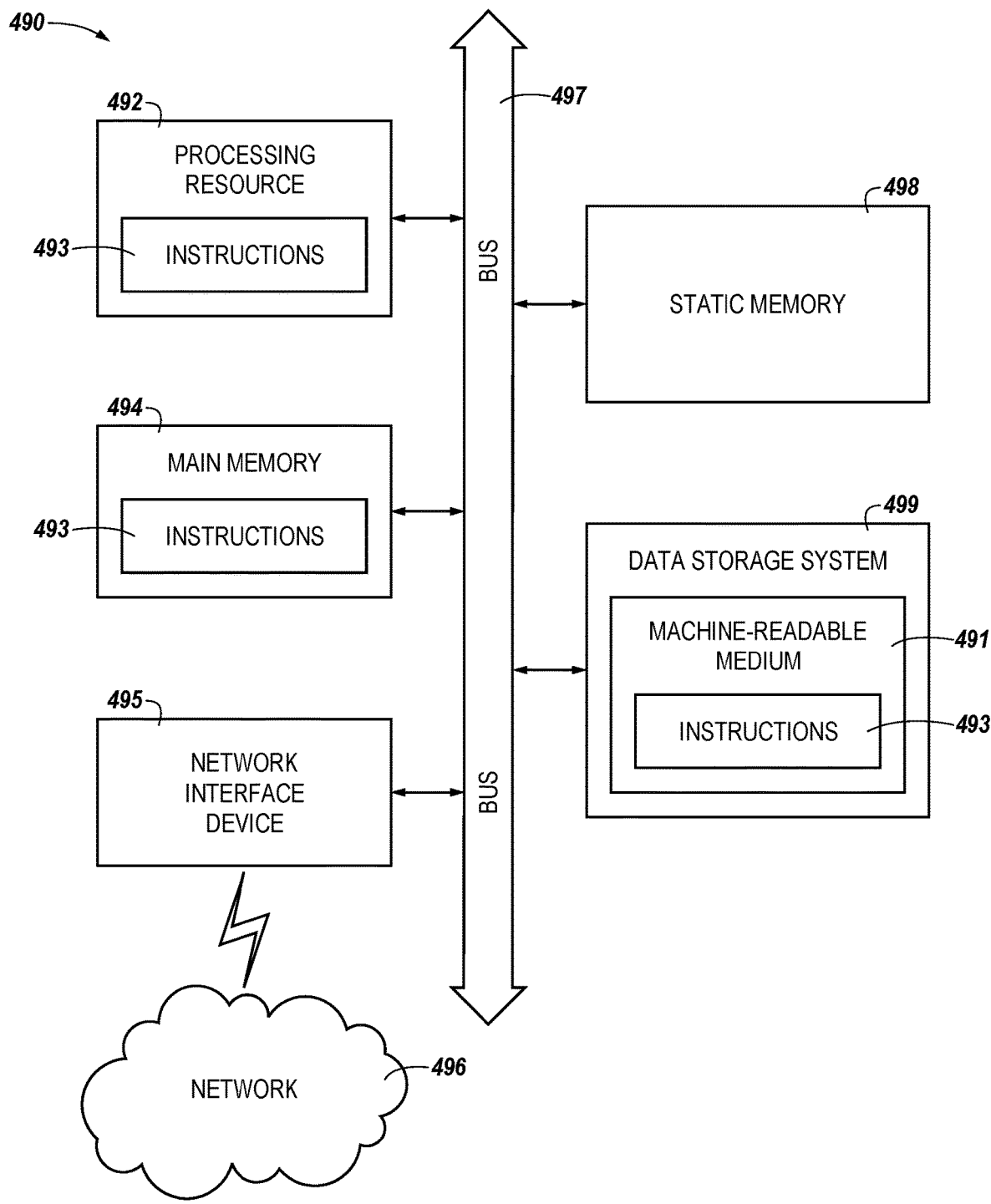
FIG. 4 illustrates an example machine of a computer system within which a set of instructions, for causing the machine to perform various methodologies discussed herein, can be executed.

FIG. 4 illustrates an example machine of a computer system 490 within which a set of instructions, for causing the machine to perform various methodologies discussed herein, can be executed. In various embodiments, the computer system 490 can correspond to a system (e.g., the computing system 100 of FIG. 1) that includes, is coupled to, or utilizes a memory sub-system (e.g., the memory device 103 of FIG. 1) or can be used to perform the operations of a controller (e.g., the control circuitry 105 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 490 includes a processing resource 492, a main memory 404 (e.g., read-only memory (ROM), flash memory, dynamic random access memory (DRAM) such as synchronous DRAM (SDRAM) or Rambus DRAM (RDRAM), etc.), a static memory 498 (e.g., flash memory, static random access memory (SRAM), etc.), and a data storage system 499, which communicate with each other via a bus 497.

Processing resource 492 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing resource 492 can also be one or more special-purpose processing devices such as an application specific integrated circuit (ASIC), a field programmable gate array (FPGA), a digital signal processor (DSP), network processor, or the like. The processing resource 492 is configured to execute instructions 493 for performing the operations and steps discussed herein. The computer system 490 can further include a network interface device 495 to communicate over the network 496.

The data storage system 499 can include a machine-readable storage medium 491 (also known as a computer-readable medium) on which is stored one or more sets of instructions 493 or software embodying any one or more of the methodologies or functions described herein. The instructions 493 can also reside, completely or at least partially, within the main memory 404 and/or within the processing resource 492 during execution thereof by the computer system 490, the main memory 404 and the processing resource 492 also constituting machine-readable storage media.

In one embodiment, the instructions 493 include instructions to implement functionality corresponding to the host 102 and/or the memory device 103 of FIG. 1. While the machine-readable storage medium 491 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

As used herein, "a number of" something can refer to one or more of such things. For example, a number of memory devices can refer to one or more memory devices. A "plurality" of something intends two or more. Additionally, designators such as "N," as used herein, particularly with respect to reference numerals in the drawings, indicates that a number of the particular feature so designated can be included with a number of embodiments of the present disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combinations of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a memory array;
   a plurality of sense amplifiers coupled to the memory array;
   a row decoder coupled to the memory array and configured to:
   activate a row of the memory array to move the data to the plurality of sense amplifiers by latching the data in the plurality of sense amplifiers that comprises transactional memory;
   deactivate the row of the memory array responsive to the data being latched by the plurality of sense amplifiers to allow a processing resource to perform a plurality of operations to determine whether it is secure to commit the data to the row of memory cells;
   receive a signal to commit the data to the row of memory cells of the memory array responsive to a result of a plurality of operations; and
   activate the row of the memory array responsive to receipt of the signal to commit the data received from the plurality of sense amplifiers.

2. The apparatus of claim 1, wherein the row decode is coupled to a control line and configured to receive the signal via a control line.

3. The apparatus of claim 2, wherein the control line is coupled to a control circuitry.

4. The apparatus of claim 3, further comprising the control circuitry configured to provide the signal via the control line responsive to receiving different signals requesting commitment of the data to the memory cells.

5. The apparatus of claim 2, wherein the control line is configured to couple the row decode to a processing resource internal to a memory device.

6. The apparatus of claim 5, further comprising the processing resource under the memory array to provide the signal via the control line.

7. The apparatus of claim 5, further comprising the processing resource coupled to data lines and configured to provide the signal via the control line.

8. A method comprising:
   writing a register of a memory device to a state to activate transactional memory of the memory device;
   activating a row of a memory array of the memory device to move data stored in the row of memory cells to the transactional memory responsive to the register being written to the state;
   deactivating the row of the memory array responsive to the data being stored by the transactional memory to allow a processing resource to perform a plurality of operations to determine whether it is secure to commit the data to the row of memory cells, wherein deactivating the row resets the memory cells such that the memory cells do not store the data; and
   determining whether to activate the row to move the data to the memory cells from the transactional memory comprising a plurality of sense amplifiers or refrain from activating the row responsive a result of the plurality of operations.

9. The method of claim 8, wherein writing the register comprises writing the register, via control circuitry of the memory device, responsive to receipt of a command from a host to activate the transactional memory.

10. The method of claim 8, wherein writing the register comprises writing the register responsive to receipt of signaling from a processing resource internal to the memory device.

11. The method of claim 8, wherein activating the row of the memory array of the memory device further comprises latching the data in sensing circuitry that comprises the transactional memory.

12. The method of claim 8, further comprising holding the data in the transactional memory concurrently while a determination is made whether to commit the data or not to commit the data to the memory cells via the plurality of operations.

13. The method of claim 12, further comprising determining whether to commit the data to the memory cells or not by determining whether it is safe to activate the row to move the data to the memory cells.

14. An apparatus comprising:
   a memory array;
   a plurality of sense amplifiers coupled to the memory array; and
   a row decode coupled to the memory array and configured to:
   activate a first row of the memory array to move data to the plurality of sense amplifiers;
   deactivate the first row of the memory array responsive to the data being latched by the plurality of sense amplifiers to allow a processing resource to perform a plurality of operations to determine whether it is secure to commit the data to the row of memory cells, wherein deactivating the first row resets memory cells coupled to the first row such that the memory cells coupled to the first row do not store the data;

receive a signal to commit the data to a second row of memory cells of the memory array; and activate the second row of the memory array responsive to receipt of the signal to move the data from the plurality of sense amplifiers to the second row.

15. The apparatus of claim 14, wherein the row decode is further configured to activate the first row concurrently with the activating of the second row to store the data to memory cells coupled to the first row of the memory array and to the memory cells coupled to the second row.

16. The apparatus of claim 14, further comprising a register coupled to the row decode and configured to provide the signal responsive to the apparatus being configured to utilize the second row of the memory cells as transactional memory.

17. The apparatus of claim 14, further comprising a processing resource coupled to the row decode and configured to:

perform a plurality of operations utilizing the data; and provide a different signal or refrain from providing the different signal to the row decode responsive to a result of the plurality of operations indicating that the data is to be committed to memory cells couple to the first row.

18. The apparatus of claim 17, wherein the row decode is further configured to:

receive the different signal via a line coupling the processing resource to the row decode;

activate the second row of the memory array to move the data to the plurality of sense amplifiers;

deactivate the second row of the memory array responsive to the data being latched in the plurality of sense amplifiers; and activate the first row of the memory array responsive to receipt of the different signal to commit the data to the first row.

19. The apparatus of claim 18, wherein the second row is a redundant row of the memory array.

* * * * *